(12) United States Patent
Kashiuchi et al.

(10) Patent No.: US 12,438,112 B2
(45) Date of Patent: Oct. 7, 2025

(54) ELECTRONIC COMPONENT

(71) Applicant: Murata Manufacturing Co., Ltd., Kyoto (JP)

(72) Inventors: Kiyohiro Kashiuchi, Nagaokakyo (JP); Toru Yaso, Nagaokakyo (JP); Hirofumi Oie, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 410 days.

(21) Appl. No.: 18/181,791

(22) Filed: Mar. 10, 2023

(65) Prior Publication Data

US 2023/0215827 A1 Jul. 6, 2023

Related U.S. Application Data

(63) Continuation of application No. PCT/JP2021/031367, filed on Aug. 26, 2021.

(30) Foreign Application Priority Data

Sep. 17, 2020 (JP) .................................. 2020-156593

(51) Int. Cl.
*H01L 23/00* (2006.01)
*H01L 23/498* (2006.01)

(52) U.S. Cl.
CPC ........ *H01L 24/08* (2013.01); *H01L 23/49838* (2013.01); *H01L 2224/08055* (2013.01); *H01L 2224/08112* (2013.01); *H01L 2224/08225* (2013.01); *H01L 2224/0913* (2013.01); *H01L 2924/182* (2013.01)

(58) Field of Classification Search
CPC ................ H01L 2924/182; H01L 2224/08225
See application file for complete search history.

(56) References Cited

U.S. PATENT DOCUMENTS

2021/0120678 A1    4/2021   Araki et al.

FOREIGN PATENT DOCUMENTS

| JP | 2005-209881 A | 8/2005 |
| JP | 4277275 B2 | 6/2009 |
| JP | 2011-066122 A | 3/2011 |
| WO | 2020/026959 A1 | 2/2020 |

OTHER PUBLICATIONS

International Search Report for PCT/JP2021/031367 dated Oct. 26, 2021.

*Primary Examiner* — Amar Movva
(74) *Attorney, Agent, or Firm* — McDonald Hopkins LLC

(57) ABSTRACT

Provided is an electronic component capable of reducing a possibility that insulating layers covering from outer edge portions of electrodes to surrounding portions, around the electrodes, of a substrate are separated from the electrodes and the substrate. An electronic component includes: a substrate; an electrode formed on a surface of the substrate; a protective portion covering at least a part of a peripheral portion of the electrode and a surrounding portion, around the electrode, of the surface of the substrate, across outer edge portions of the electrode, and extending in a circumferential direction along the outer edge portions of the electrode; and an extending portion extending, on the surface of the substrate, from the protective portion in an extending direction away from the electrode. A width of the extending portion perpendicular to the extending direction is longer than a width of the protective portion perpendicular to the circumferential direction.

20 Claims, 10 Drawing Sheets

ELECTRONIC COMPONENT

CROSS REFERENCE TO RELATED APPLICATION

This is a continuation of International Application No. PCT/JP2021/031367 filed on Aug. 26, 2021 which claims priority from Japanese Patent Application No. 2020-156593 filed on Sep. 17, 2020. The contents of these applications are incorporated herein by reference in their entireties.

BACKGROUND OF THE DISCLOSURE

Field of the Disclosure

The present disclosure relates to an electronic component in which electrodes are formed on a surface of a substrate.

Description of the Related Art

In electronic components, components are mounted on electrodes formed on a surface of a substrate, with solder or the like interposed between the electrodes and the components. In a case where an external impact acts on an electronic component, bonding strength of electrodes to a substrate weakens due to bending of the substrate, or the like. This may result in removal of mounted components from the electronic component.

In view of this, insulating layers made of ceramic or the like are stacked, across outer edge portions of electrodes, on peripheral portions of the electrodes and surrounding portions, around the electrodes, of a surface of a substrate (see, for example, Patent Document 1). This reinforces bonding of the electrodes to the substrate.

Patent Document 1: Japanese Patent No. 4277275

BRIEF SUMMARY OF THE DISCLOSURE

There is a problem, however, that in a case where an external impact acts on an electronic component, insulating layers are separated from electrodes and a substrate due to bending of the substrate, or the like. In a case where the insulating layers are separated from the electrodes and the substrate, bonding of the electrodes to the substrate are not reinforced by the insulating layers. As a result, bonding strength of the electrodes to the substrate weakens.

Hence, a possible benefit of the present disclosure is to provide, in order to solve the problem described above, an electronic component capable of reducing a possibility that protective portions which cover peripheral portions of electrodes and surrounding portions, around the electrodes, of a surface of a substrate, across outer edge portions of electrodes are separated from the electrodes and the substrate.

In order to achieve the object, the present disclosure is configured as follows. An electronic component according to an aspect of the present disclosure includes: a substrate; an electrode formed on a surface of the substrate; a protective portion covering at least a part of a peripheral portion of the electrode and a surrounding portion, around the electrode, of the surface of the substrate, across outer edge portions of the electrode, and extending in a circumferential direction along the outer edge portions of the electrode; and an extending portion extending, on the surface of the substrate, from the protective portion in an extending direction away from the electrode, and a width of the extending portion perpendicular to the extending direction is longer than a width of the protective portion perpendicular to the circumferential direction.

According to the present disclosure, it is possible to reduce a possibility that protective portions which cover peripheral portions of electrodes and surrounding portions, around the electrodes, of a surface of a substrate, across outer edge portions of electrodes are separated from the electrodes and the substrate.

DETAILED DESCRIPTION OF THE DISCLOSURE

Figure 1:
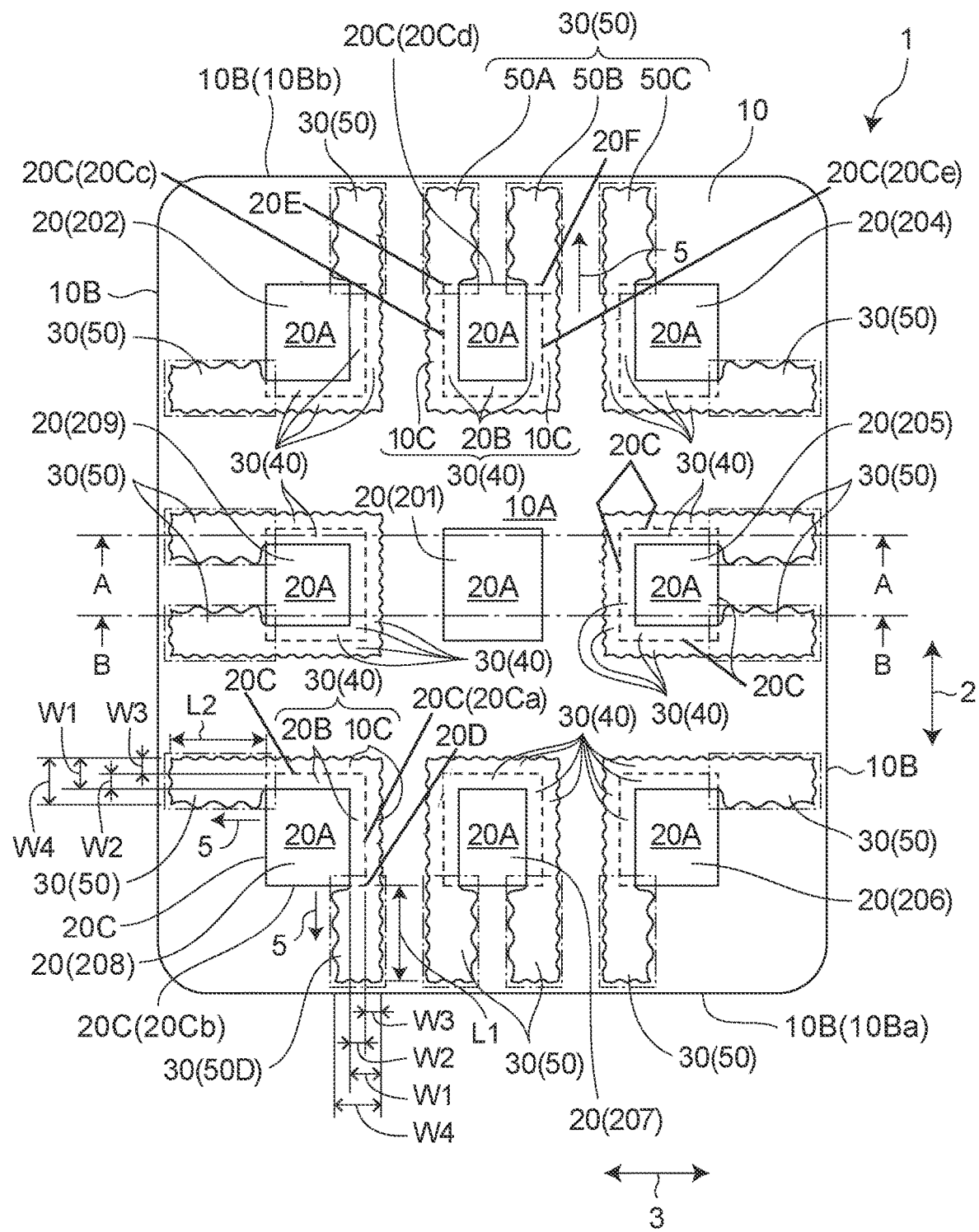
FIG. 1 is a plan view of an electronic component according to a first embodiment of the present disclosure.

An electronic component according to an aspect of the present disclosure includes: a substrate; an electrode formed on a surface of the substrate; a protective portion covering at least a part of a peripheral portion of the electrode and a surrounding portion, around the electrode, of the surface of the substrate, across outer edge portions of the electrode, and extending in a circumferential direction along the outer edge portions of the electrode; and an extending portion extending, on the surface of the substrate, in an extending direction away from the protective portion and the electrode, and a width of the extending portion perpendicular to the extending direction is longer than a width of the protective portion perpendicular to the circumferential direction in a case where the substrate is seen in plan view.

According to this configuration, the protective portion is reinforced by the extending portion extending from the protective portion. It is thus possible to reduce a possibility that the protective portion is separated from the electrode and the substrate.

The extending portion extends toward a closest outer edge portion among outer edge portions of the substrate. In a case where an external impact acts on the electronic component, the closer to the outer edge portions, the more the substrate bends. According to this configuration, the extending portion extends toward the outer edge portion of the substrate, where the substrate bends largely. Separation of the protective portion from the electrode and the substrate due to bending of the substrate is thus inhibited by the extending portion.

The extending portion extends to a vicinity of outer edge portions of the substrate. In a case where an external impact acts on the electronic component, the closer to the outer edge portions, the more the substrate bends. According to this configuration, the extending portion extends to the vicinity of the outer edge portions of the substrate, where the substrate bends largely. Separation of the protective portion from the electrode and the substrate due to bending of the substrate is thus inhibited by the extending portion.

A length of the extending portion in the extending direction is longer than a width of a surrounding portion, around the electrode, of the protective portion. According to this configuration, the extending portion is long in the extending direction. It is thus possible to reduce a possibility that the extending portion is separated from the substrate by an external impact. As a result, it is possible to reduce a possibility that the protective portion is separated from the electrode and the substrate.

A surface of the electrode has a quadrilateral shape, the protective portion covers the peripheral portion of the electrode and the surrounding portion, around the electrode, of the surface of the substrate, across a first side of the surface of the electrode, and extends along the first side, and the extending portion extends in the extending direction from a boundary portion between the first side and a second side, adjacent to the first side, of the surface of the electrode, and is in contact with a side surface, adjacent to the second side, of the electrode.

The electronic component according to any one of claims 1 to 4, wherein a surface of the electrode has a quadrilateral shape, the protective portion covers the peripheral portion of the electrode and the surrounding portion, around the electrode, of the surface of the substrate, across a first side of the surface of the electrode and a third side of the surface of the electrode, the third side connected to the first side with a second side of the surface of the electrode interposed between the third side and the first side, the third side extending in parallel to the first side, and extends along the first side and the third side, the extending portion includes: a first extending portion extending in the extending direction from a boundary portion between the first side and the second side; and a second extending portion extending in the extending direction from a boundary portion between the third side and the second side, and the first extending portion and the second extending portion are in contact with a side surface, adjacent to the second side, of the electrode.

In the outer edge portions of the quadrilateral electrode, bonding strength of a vertex portion to the substrate tends to weaken. According to these configurations, the extending portion extends from the boundary portion between the first side and the second side or the boundary portion between the third side and the second side of the quadrilateral electrode, that is, the vertex portion of the quadrilateral electrode. It is therefore possible to increase the bonding of the vertex portion of the quadrilateral electrode to the substrate.

The extending portion includes an expanding portion expanding toward a side opposite to the second side of the surface of the electrode with respect to an imaginary line passing through the first side of the surface of the electrode. According to this configuration, the expanding portion increases the area of the extending portion. It is therefore possible to reduce a possibility that the extending portion is separated from the substrate. It is thus possible to reduce a possibility that the protective portion is separated from the electrode and the substrate.

A plurality of the electrodes are formed on the surface of the substrate, the electrode located on an outermost periphery of the surface of the substrate among the plurality of electrodes is covered with the protective portion from which the extending portion extends, and the extending portion extends toward a closest outer edge portion among outer edge portions of the substrate.

In a case where an external impact acts on the electronic component, the closer to the outer edge portions, the more the substrate bends. In a configuration in which the plurality of electrodes are formed on the surface of the substrate, therefore, the electrode located at the outermost periphery among the plurality of electrodes is greatly affected by the bending of the substrate. That is, in a case where the substrate bends, the protective portion covering the electrode located at the outermost periphery is likely to be separated from the electrode and the substrate. According to this configuration, the electrode located at the outermost periphery is covered with the protective portion from which the extending portion extends. It is thus possible to inhibit separation of the protective portion, which covers the electrode located at the outermost periphery, from the electrode and the substrate by the extending portion.

A surface of each electrode has a quadrilateral shape, and the extending portion is located between a side located on a peripheral side of the surface of the substrate among the sides of the surface of the electrode, and the outer edge portion closest to the electrode among the outer edge portions of the substrate.

In a case where an external impact acts on the electronic component, the closer to the outer edge portions, the more the substrate bends. In a case where the substrate bends, therefore, in the quadrilateral electrode located at the outermost periphery, the portion closer to the outer edge portion of the substrate is largely affected by the bending of the substrate. That is, in a case where the substrate bends, in the protective portion covering the quadrilateral electrode located at the outermost periphery, the protective portion covering the portion closer to the outer edge portion of the substrate is likely to be separated from the electrode and the substrate. According to this configuration, in the quadrilateral electrode located at the outermost periphery, the extending portion is provided near the outer edge portion of the substrate. It is thus possible to inhibit separation of the protective portion, which covers the electrode located at the outermost periphery, from the electrode and the substrate by the extending portion.

A plurality of the extending portions are provided, and each of the extending portions is spaced away from the other extending portions. If the plurality of extending portions are connected to each other, the area of each of the plurality of extending portions connected to each other increases. This increases an influence of the contraction of the substrate on the extending portion because of a difference in contraction ratio between the extending portion and the substrate, which may cause the extending portion to crack. According to this configuration, each of the extending portions is spaced away from the other extending portions. An increase in area of the extending portion is thus inhibited. As a result, it is possible to reduce a possibility of occurrence of the foregoing cracking of the extending portion.

First Embodiment

Figure 2:
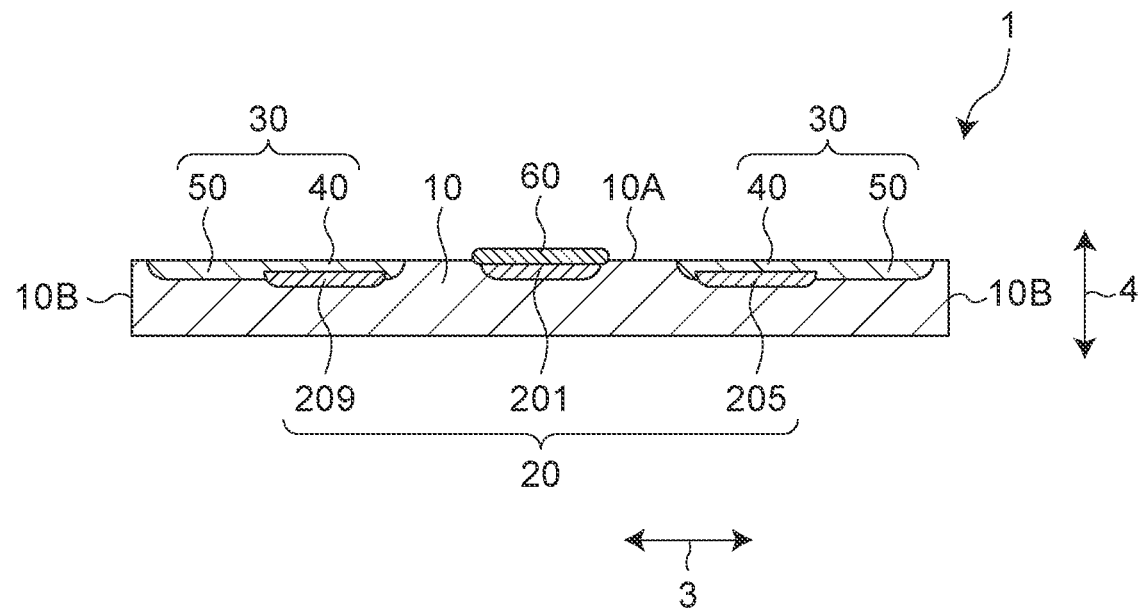
FIG. 2 is a sectional view taken along line A-A in FIG. 1.
Figure 3:
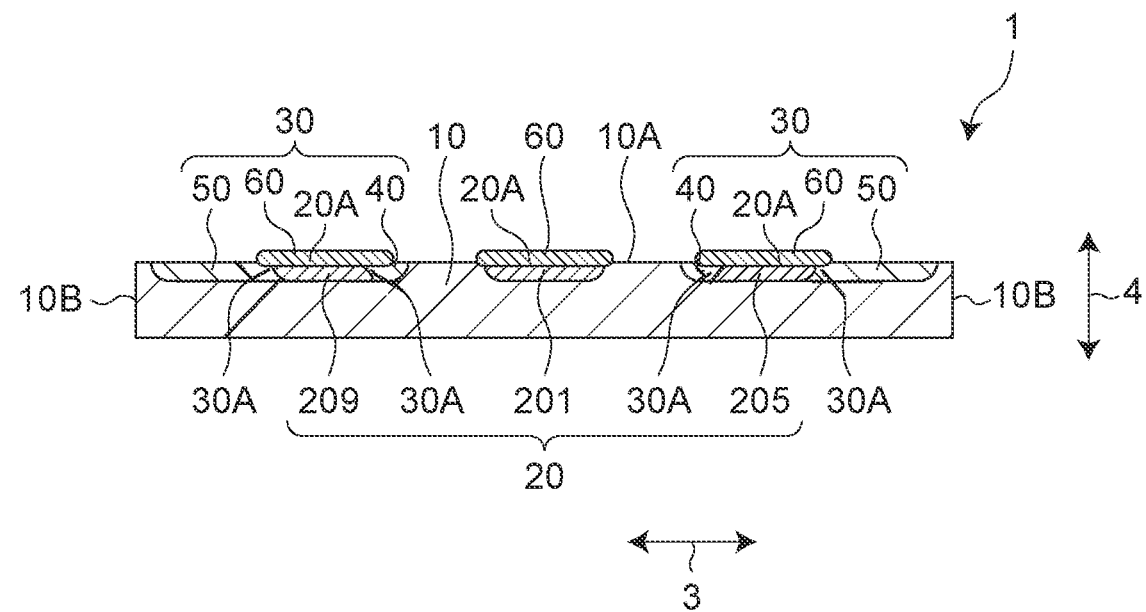
FIG. 3 is a sectional view taken along line B-B in FIG. 1.

FIG. 1 is a plan view of an electronic component according to a first embodiment of the present disclosure. FIG. 2 is a sectional view taken along line A-A in FIG. 1. FIG. 3 is a sectional view taken along line B-B in FIG. 1.

As illustrated in FIGS. 1 to 3, in an electronic component 1, electrodes 20 are formed on a surface 10A of a substrate 10. Various components such as a resistor, a coil, a capacitor, a diode, a transistor, and an integrated circuit are mounted on the surface 10A of the substrate 10 with the electrodes 20 interposed between these components and the surface 10A. A wiring pattern (not illustrated) made of a conductor such as copper or aluminum may be formed at least on the surface 10A of the electronic component 1 or in the electronic component 1. In this case, the components mounted on the electronic component 1 are electrically connected to each other through the wiring pattern. The electronic component 1 functions as an electronic circuit by mounting the components. The electronic component 1 is not limited to an electronic component having a plate shape as illustrated in FIGS. 1 to 3, but may be any electronic component in which the electrodes 20 are formed on the substrate 10. For example, the electronic component 1 may be an LC filter having a rectangular parallelepiped shape or the like. In this case, a main body portion of the LC filter having a rectangular parallelepiped shape or the like equates the substrate.

As illustrated in FIGS. 1 to 3, the electronic component 1 includes the substrate 10, the electrodes 20, protective films 30, and plating films 60 (see FIGS. 2 and 3). The plating films 60 are not illustrated in FIG. 1.

Figure 11:
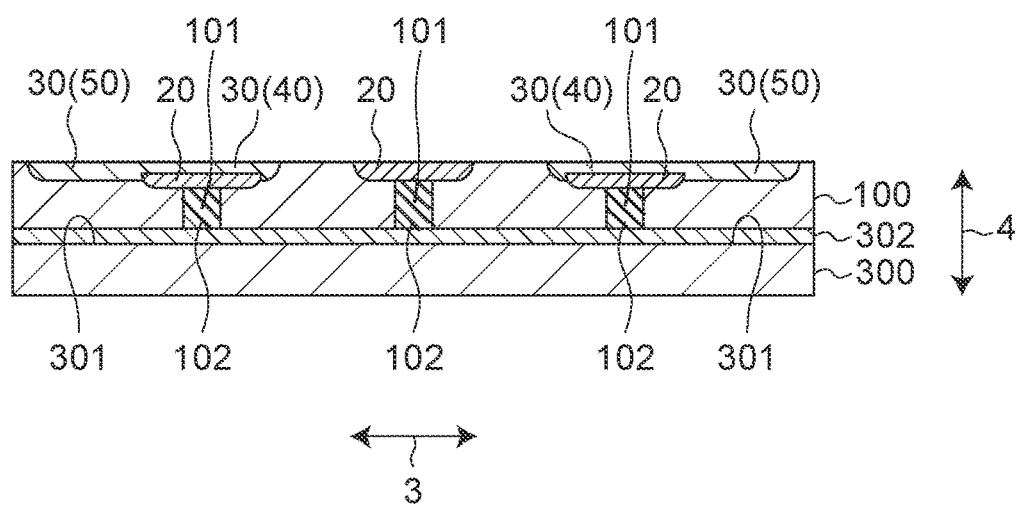
FIG. 11 is a sectional view of a sheet obtained in such a manner that the sheet of FIG. 10 is subjected to press bonding.

The electronic component 1 of the first embodiment includes a sheet 200 on which the substrate 10 is stacked (see FIG. 11). The sheet 200 is neither illustrated nor described in FIGS. 1 to 3.

The substrate 10 is a member having a rectangular-parallelepiped plate shape. In the first embodiment, the substrate 10 has a quadrilateral shape in plan view. The shape of the substrate 10 in plan view is not limited to a quadrilateral shape. For example, the shape of the substrate 10 in plan view may be a circular shape or the like.

In the following description, directions along which the opposite sides of the substrate 10 having a rectangular parallelepiped shape extend are defined as a lengthwise direction 2, a widthwise direction 3, and a heightwise direction 4, respectively. In FIGS. 2 and 3, a side where the protective films 30 are formed is defined as an upper side.

The substrate 10 is made of an insulator. In the first embodiment, the substrate 10 is made of ceramic. The substrate 10 may be made of, in addition to ceramic, glass epoxy, Teflon (registered trademark), paper phenol, or the like.

The plurality of electrodes 20 are formed on the surface 10A of the substrate 10. In the first embodiment, nine electrodes 20 are formed as illustrated in FIG. 1. The nine electrodes 20 are arranged in a three-by-three matrix. In other words, three rows of electrode groups each including three electrodes 20 arranged at equal intervals along the lengthwise direction 2 are arranged at equal intervals along the widthwise direction 3. The number of electrodes 20 is not necessarily nine. In addition, the plurality of electrodes 20 are not necessarily arranged in a square matrix. For example, in a case where eight electrodes 20 are formed, the eight electrodes 20 may be arranged in such a manner that two rows of electrode groups each including four electrodes 20 arranged at intervals along the lengthwise direction 2 are arranged at intervals along the widthwise direction 3. Alternatively, the plurality of electrodes 20 are not necessarily arranged in a matrix. For example, the plurality of electrodes 20 may be arranged at intervals on the same circumference. Alternatively, the intervals between the adjacent electrodes 20 of the plurality of electrodes 20 are not necessarily equal.

Each electrode 20 has a square shape in plan view, that is, a surface 20A of each electrode 20 has a square shape. That is, the surface 20A of each electrode 20 has a shape whose all four sides are equal, among quadrilateral shapes. The quadrilateral shapes described above include not only an exactly quadrilateral shape, but also a substantially quadrilateral shape, such as a quadrilateral shape whose corners are beveled. In addition, the shape of the surface 20A of each electrode 20 is not limited to a square shape. For example, the surface 20A of each electrode 20 may have a quadrilateral shape different from a square shape, or may have any shape (e.g., a triangular shape or a circular shape) different from a quadrilateral shape. Alternatively, the surfaces 20A of the electrodes 20 may be equal in shape to each other as illustrated in FIG. 1, or may be different in shape from each other.

One side of the square of the surface 20A of each electrode 20 is approximately 200 μm. The size of the surface 20A of each electrode 20 is not limited to the size described above (a square with one side of approximately 200 μm).

Among the plurality of electrodes 20 formed on the surface 10A of the substrate 10, a length between each of the electrodes 20 located on the outermost periphery of the surface 10A of the substrate 10 and one of outer edge portions 10B of the substrate 10 is set to a range from 125 μm to 175 μm. The electrodes 20 located at the outermost periphery refer to ones among the plurality of electrodes 20, and no electrode 20 exists between each electrode 20 located at the outermost periphery and the corresponding outer edge portion 10B of the surface 10A of the substrate 10 in at least one of four directions in plan view. In the first embodiment, the electrodes 20 located at the outermost periphery are, among the nine electrodes 201 to 209 formed on the surface 10A of the substrate 10, the electrodes 202 to 209 excluding the electrode 201. The length between each of the electrodes 20 located at the outermost periphery and the corresponding outer edge portion 10B of the substrate 10 is not limited to the length described above (125 μm to 175 μm).

The nine electrodes 20 are made of a conductor such as copper, silver, or aluminum.

As illustrated in FIG. 1, each protective film 30 covers, among the plurality of electrodes 20 formed on the surface 10A of the substrate 10, the corresponding electrode 20 located at the outermost periphery of the surface 10A of the substrate 10. In the first embodiment, the protective films 30 cover, among the nine electrodes 201 to 209 formed on the surface 10A of the substrate 10, the eight electrodes 202 to 209. That is, the protective films 30 are provided in correspondence with the eight electrodes 202 to 209. In the following description, the electrodes 201 to 209 are collectively referred to as the electrode 20.

A protective film 30 may be formed to cover an electrode 20 different from the electrodes 20 located on the outermost periphery of the surface 10A of the substrate 10. For example, the protective film 30 may cover the electrode 201. Alternatively, the electrodes 20 located at the outermost periphery of the surface 10A of the substrate 10 are not necessarily covered with the protective films 30. For example, among the electrodes 202 to 209, only the electrodes 202, 204, 206, and 208 may be covered with the protective films 30 while the electrodes 203, 205, 207, and 209 are not necessarily covered with the protective films 30.

Figure 15:
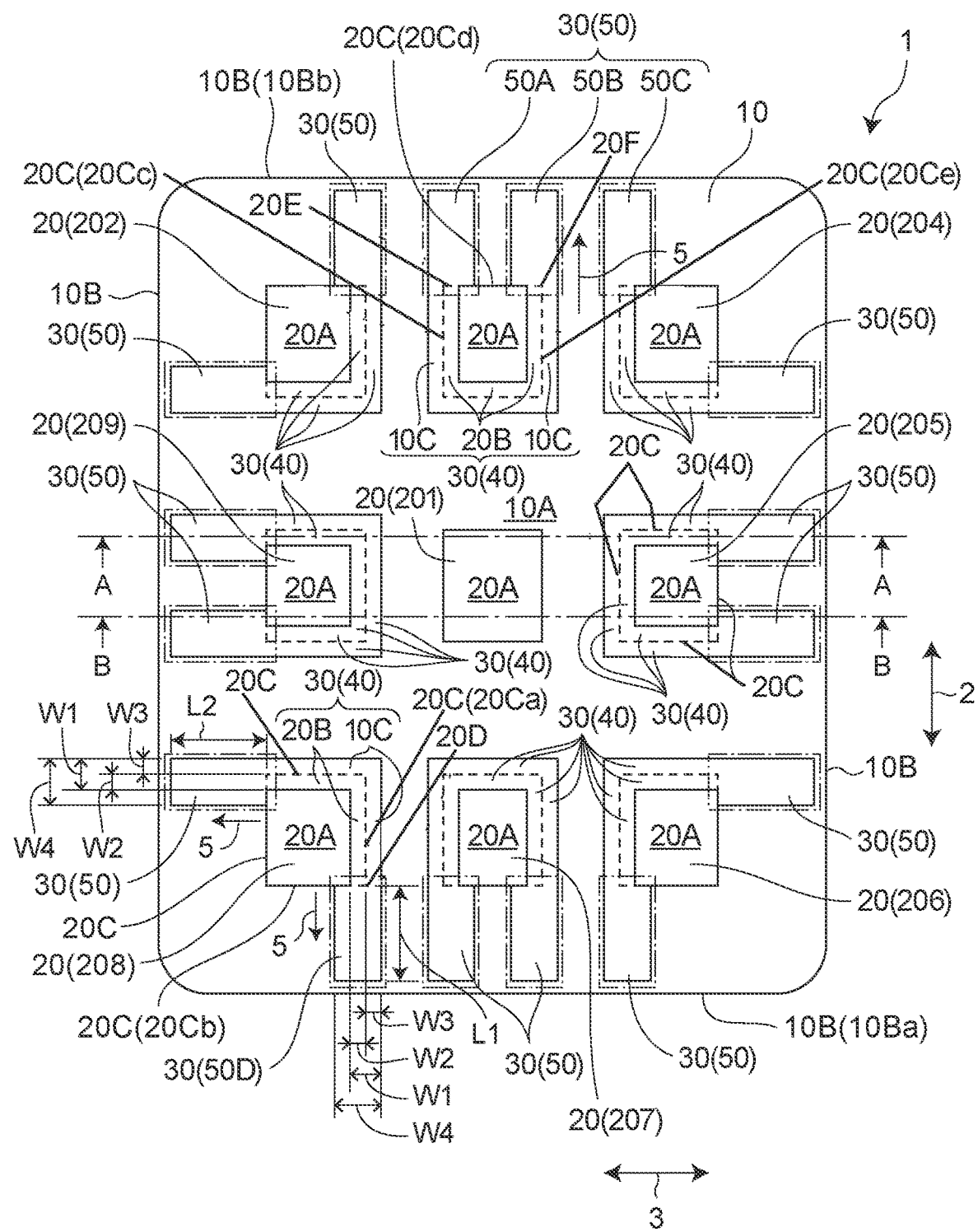
FIG. 15 is a plan view of an electronic component according to still another modification of the first embodiment of the present disclosure.

Each protective film 30 covers a part of the surface 10A of the substrate 10 and a part of the surface 20A of the corresponding electrode 20. As illustrated in FIG. 1, an edge portion of each protective film 30 in plan view has a substantially wavy shape caused by spreading that occurs in forming the protective film 30 by screen printing or the like. With regard to the edge portion of each protective film 30, the amount of spreading at an inner side of an extending portion 50 to be described later is larger than at an outer side of the extending portion 50. In order to understand the difference between the amounts of spreading, FIG. 1 illustrates the amplitude of waves at the inner side to be larger than the amplitude of waves at the outer side. The amounts of spreading can be reduced by a printing method such as screen printing. The amplitudes of waves are therefore not limited to those illustrated in FIG. 1. Alternatively, the amplitudes of waves can be reduced to zero or substantially zero. In this case, the edge portion of each protective film 30 in plan view has a substantially linear shape instead of a wavy shape, as illustrated in FIG. 15.

The protective films 30 are made of ceramic such as low-temperature co-fired ceramic (LTCC). The material for the protective films 30 is not limited to ceramic, and examples thereof include resin materials such as polyimide.

Each protective film 30 includes a protective portion 40 and an extending portion 50. The protective films 30 covering the electrodes 20 are substantially equal in configuration to each other. Therefore, in the following description, the configuration of the protective film 30 covering the electrode 208 will be described in detail. Meanwhile, the configurations of the protective films 30 covering the other electrodes 201 to 207 and 209 will not be described. The other electrodes 201 to 207 and 209 as well as the protective films 30 covering the electrodes 201 to 207 and 209 will be mentioned as necessary.

The protective portion 40 constitutes a part of the protective film 30. In FIG. 1, the protective portion 40 is a portion, which is not surrounded by a dot-and-dash line, of the protective film 30. The protective portion 40 covers a part of a peripheral portion 20B of the electrode 208 and a surrounding portion 10C, around the electrode 208, of the surface 10A of the substrate 10, across outer edge portions 20C of the electrode 208.

In the first embodiment, a portion, which is not surrounded by the protective portion 40, of the surface 20A of the electrode 20 (i.e., each of the electrodes 201 to 209) has a quadrilateral shape such as a square shape. The portion may have any shape in addition to a quadrilateral shape.

The peripheral portion 20B of the electrode 20 is a portion excluding the central portion of the electrode 20 in plan view. In other words, the peripheral portion 20B of the electrode 20 is a portion around the sides of the square of the surface 20A of the electrode 20. For example, the peripheral portion 20B of the electrode 20 ranges from one side of the square of the electrode 20 in plan view to one-eighth of the length of the side of the square inside the electrode 20. The peripheral portion 20B of the electrode 20 may have a range different from the range described above. For example, the peripheral portion 20B of the electrode 20 may range from one side of the square of the electrode 20 in plan view to one-sixth of the length of the side of the square inside the electrode 20.

The surrounding portion 10C, around the electrode 20, of the surface 10A of the substrate 10 is a portion, near the electrode 20, of the surface 10A of the substrate 10. For example, the surrounding portion 10C, around the electrode 20, of the surface 10A of the substrate 10 ranges from one side of the square of the electrode 20 in plan view to one-eighth of the length of the side of the square outside the electrode 20. The surrounding portion 10C, around the electrode 20, of the surface 10A of the substrate 10 may have a range different from the range described above. For example, the surrounding portion 10C, around the electrode 20, of the surface 10A of the substrate 10 may range from one side of the square of the electrode 20 in plan view to one-sixth of the length of the side of the square outside the electrode 20.

The outer edge portions 20C of the electrode 20 are the sides of the square of the surface 20A of the electrode 20, or a portion including vicinities of the sides of the square of the surface 20A of the electrode 20 in addition to the sides. The vicinity of each side includes not only the surface 20A of the electrode 20 including the side, but also a side surface, adjacent to the side, of the electrode 20. The side surface of the electrode 20 is a surface extending from the side of the square of the surface 20A of the electrode 20 to the surface 10A of the substrate 10. In other words, the side surface of the electrode 20 is adjacent to the side of the square of the surface 20A of the electrode 20, and is a surface connecting the surface 20A of the electrode 20 to the surface 10A of the substrate 10. The outer edge portions 20C of the electrode 20 refer to a portion, located outward of the peripheral portion 20B of the electrode 20, of the electrode 20. In the first embodiment, the outer edge portions 20C of the electrode 20 are the sides of the square of the surface 20A of the electrode 20.

The protective portion 40 extends in a circumferential direction along the sides of the square of the surface 20A of the electrode 20. In other words, the circumferential direction is a direction along the outer edge portions 20C of the electrode 20.

A width W1 of the protective portion 40 is a sum of a width W2 of the peripheral portion 20B of the electrode 20 and a width W3 of the surrounding portion 10C, around the electrode 20, of the surface 10A of the substrate 10. The width W1 of the protective portion 40 is a length of the protective portion 40 in a direction perpendicular to the circumferential direction, in plan view. The width W2 of the peripheral portion 20B of the electrode 20 is a length of the peripheral portion 20B in the direction perpendicular to the circumferential direction, in plan view. The width W3 of the surrounding portion 10C, around the electrode 20, of the surface 10A of the substrate 10 is a length of the surrounding portion 10C in the direction perpendicular to the circumferential direction, in plan view.

In the first embodiment, the width W1 is approximately 50 µm, the width W2 is approximately 25 µm, and the width W3 is approximately 25 µm. The lengths of the widths W1, W2, and W3 are not limited to the lengths described above.

The widths W1, W2, and W3 are not necessarily fixed. In FIG. 1, for example, the width W1 along the lengthwise direction 2 may be different in length from the width W1 along the widthwise direction 3. The same applies to the widths W2 and W3.

The extending portion 50 constitutes a part of the protective film 30. In FIG. 1, the extending portion 50 is a portion, which is surrounded by a dot-and-dash line, of the protective film 30. The extending portion 50 covers a part of the surface 10A of the substrate 10 from above. Meanwhile, the extending portion 50 does not cover the surface 20A of the electrode 20. The extending portion 50 may cover a part of the surface 20A of the electrode 20.

The electronic component 1 includes a plurality of the extending portions 50. In the first embodiment, two extending portions 50 are provided for each electrode 20.

Each of the extending portions 50 is spaced away from the other extending portions 50. Each of the extending portions 50 may be connected to a different one of the extending portions 50. In FIG. 1, for example, the extending portions 50A and 50B provided for the electrode 203 are spaced away from each other. However, the extending portions 50A and 50B may be connected to each other. Alternatively, in FIG. 1, the extending portion 50C provided for the electrode 204 is spaced away from the extending portion 50B provided for the electrode 203, for example. However, the extending portions 50C and 50B may be connected to each other.

Each extending portion 50 extends from the protective portion 40 in an extending direction 5. The extending direction 5 is a direction away from the protective portion 40 and the electrode 20. In the first embodiment, the extending direction 5 is perpendicular to the circumferential direction. However, the extending direction 5 may be a direction inclined with respect to the circumferential direction.

In the first embodiment, the extending portion 50 extends from the protective portion 40 toward the closest outer edge portion 10B among the outer edge portions 10B of the substrate 10.

In the case of the electrode 208, for example, in FIG. 1, the extending portion 50 of the electrode 208 extending from the lower end in FIG. 1 extends downward in FIG. 1 from the protective portion 40, toward the outer edge portion 10B located at the lower end in FIG. 1 among the outer edge portions 10B of the substrate 10. In addition, the extending portion 50 of the electrode 208 extending from the left end in FIG. 1 extends leftward in FIG. 1 from the protective portion 40, toward the outer edge portion 10B located at the left end in FIG. 1 among the outer edge portions 10B of the substrate 10.

The extending portion 50 is located between the side located on a peripheral side of the surface 10A of the substrate 10 among the sides of the square of the surface 20A of the electrode 20, and the outer edge portion 10B closest to the electrode 20 among the outer edge portions 10B of the substrate 10.

For example, among the sides of the square of the surface 20A of the electrode 208, the sides located on the peripheral side of the surface 10A of the substrate 10 are, among the outer edge portions 20C of the electrode 208, the outer edge portion 20C on the lower side in FIG. 1 and the outer edge portion 20C on the left side in FIG. 1. One of the two extending portions 50 for the electrode 208 is located between the outer edge portion 20C on the lower side in FIG. 1 among the outer edge portions 20C of the electrode 208, and the outer edge portion 10B, on the lower side in FIG. 1, which is closest to the outer edge portion 20C among the outer edge portions 10B of the substrate 10. In addition, the other one of the two extending portions 50 for the electrode 208 is located between the outer edge portion 20C on the left side in FIG. 1 among the outer edge portions 20C of the electrode 208, and the outer edge portion 10B, on the left side in FIG. 1, which is closest to the outer edge portion 20C among the outer edge portions 10B of the substrate 10.

In addition, for example, among the sides of the square of the surface 20A of the electrode 205, the side located on the peripheral side of the surface 10A of the substrate 10 is, among the outer edge portions 20C of the electrode 205, the outer edge portion 20C on the right side in FIG. 1. The two extending portions 50 for the electrode 205 are located between the outer edge portion 20C on the right side in FIG. 1 among the outer edge portions 20C of the electrode 205, and the outer edge portion 10B, on the right side in FIG. 1, which is closest to the outer edge portion 20C among the outer edge portions 10B of the substrate 10.

Each extending portion 50 extends to the vicinity of the outer edge portion 10B of the substrate 10. In the first embodiment, one side of the square of the surface 20A of each electrode 20 is approximately 200 µm as described above. In the first embodiment having this configuration, a length between an end portion, closer to the outer edge portion 10B, of each extending portion 50 and the outer edge portion 10B of the substrate 10 is set to approximately 10 µm. This length is appropriately set in accordance with the size of the substrate 10, the size of the electrode 20, and the like, and is not limited to 10 µm. For example, the length between the end portion, close to the outer edge portion 10B, of the extending portion 50 and the outer edge portion 10B of the substrate 10 may be set to approximately 50 to 70 µm. Alternatively, the extending portion 50 does not necessarily extend to the vicinity of the outer edge portion 10B of the substrate 10.

A width W4 of each extending portion 50 is longer than the width W1 of the protective portion 40. The width W4 of the extending portion 50 is a length of the extending portion 50 in the direction perpendicular to the extending direction 5. The width W4 may have a length of the width W1 or less.

The width W4 is set to approximately 75 µm in the first embodiment; however, the width W4 may be any length in addition to the length described above.

In the first embodiment, lengths L1 and L2 of the extending portions 50 in the extending direction 5 are longer than the width W3 of the surrounding portion 10C, around the electrode 20, of the surface 10A of the substrate 10. The length L1 is a length, in the extending direction 5, of the extending portion 50 extending downward in FIG. 1 from the electrode 208. The length L2 is a length, in the extending direction 5, of the extending portion 50 extending leftward in FIG. 1 from the electrode 208. The length L1 and the length L2 may be equal to or different from each other.

The lengths L1 and L2 of the extending portions 50 in the extending direction 5 are preferably, but are not limited to, a half or more of one side of the figure (the square in the first embodiment) constituting the surface 20A of the electrode 20.

The lengths L1 and L2 are each approximately 200 µm in the first embodiment; however, the lengths L1 and L2 may be any lengths in addition to the lengths described above.

In the first embodiment, each extending portion 50 extends from a vicinity of a vertex of the square of the surface 20A of the electrode 20 toward the outer edge portion 10B of the substrate 10, and is in contact with the side surface adjacent to the side of the square extending from the vertex. Hereinafter, as a specific example of the configuration described above, the configuration of one of the extending portions 50D extending downward in FIG. 1 from the electrode 208 will be described. The other extending portion 50D is similar in configuration to the extending portion 50D to be described below.

The extending portion 50D extends, in the extending direction 5, from a vicinity of a vertex 20D of the square of the surface 20A of the electrode 208 toward an outer edge portion 10Ba of the substrate 10. The vertex 20D is an example of a boundary portion between two sides of the square of the surface 20A of the electrode 20. Here, the two sides are outer edge portions 20Ca and 20Cb of the electrode 20, which are two sides adjacent to each other. The outer edge portion 20Ca of the electrode 20 is an example of a first side of the surface 20A of the electrode 20. The outer edge portion 20Cb of the electrode 20 is an example of a second side of the surface 20A of the electrode 20.

The protective portion 40 connected to the extending portion 50D in the vicinity of the vertex 20D covers a part of the peripheral portion 20B of the electrode 20 and the surrounding portion 10C, around the electrode 20, of the surface 10A of the substrate 10, across the outer edge portion 20Ca of the electrode 20. In addition, the protective portion 40 extends along the outer edge portion 20Ca.

The extending portion 50D is connected to a part of the protective portion 40 (the surrounding portion 10C, around the electrode 20, of the surface 10A of the substrate 10), on a side opposite to the outer edge portion 20Cb of the electrode 20 with respect to the vertex 20D (the right side of the vertex 20D in FIG. 1). In addition, the extending portion 50D is connected to another part of the protective portion 40 (the peripheral portion 20B of the electrode 20), on a side closer to the outer edge portion 20Cb of the electrode 20 with respect to the vertex 20D (the left side of the vertex 20D in FIG. 1). Further, the extending portion 50D is in contact with the side surface of the electrode 20 adjacent to the outer edge portion 20Cb of the electrode 20, on a side opposite to the vertex 20D with respect to the location connected to the peripheral portion 20B of the electrode 20. The extending portion 50D may be, on the opposite side, in contact with the surface 20A of the electrode 20 adjacent to the outer edge portion 20Cb of the electrode 20. Alternatively, the extending portion 50D is not necessarily in contact with the outer edge portion 20Cb of the electrode 20.

Hereinafter, configurations of the extending portions 50A and 50B will be described.

The extending portions 50A and 50B respectively extend, in the extending directions 5, from vicinities of vertexes 20E and 20F of the square of the surface 20A of the electrode 203 toward the corresponding outer edge portion 10Bb of the substrate 10. Each of the vertexes 20E and 20F is an example of a boundary portion between two sides of the square of the surface 20A of the electrode 20.

Here, the two sides that form the vertex 20E are outer edge portions 20Cc and 20Cd of the electrode 20, which are two sides adjacent to each other. In addition, the two sides that form the vertex 20F are outer edge portions 20Cd and 20Ce of the electrode 20, which are two sides adjacent to each other.

The outer edge portion 20Ce is connected to the outer edge portion 20Cc with the outer edge portion 20Cd interposed between the outer edge portion 20Ce and the outer edge portion 20Cc. The outer edge portion 20Cc and the outer edge portion 20Ce are parallel to each other. The outer edge portion 20Cc of the electrode 20 is an example of the first side of the surface 20A of the electrode 20. The outer edge portion 20Cd of the electrode 20 is an example of the second side of the surface 20A of the electrode 20. The outer edge portion 20Ce of the electrode 20 is an example of a third side of the surface 20A of the electrode 20.

The protective portion 40 connected to the extending portion 50A in the vicinity of the vertex 20E covers a part of the peripheral portion 20B of the electrode 20 and the surrounding portion 10C, around the electrode 20, of the surface 10A of the substrate 10, across the outer edge portion 20Cc of the electrode 20. In addition, the protective portion 40 extends along the outer edge portion 20Cc.

The protective portion 40 connected to the extending portion 50B in the vicinity of the vertex 20F covers a part of the peripheral portion 20B of the electrode 20 and the surrounding portion 10C, around the electrode 20, of the surface 10A of the substrate 10, across the outer edge portion 20Ce of the electrode 20. In addition, the protective portion 40 extends along the outer edge portion 20Ce.

The extending portion 50A is connected to a part of the protective portion 40 (the surrounding portion 10C, around the electrode 20, of the surface 10A of the substrate 10), on a side opposite to the outer edge portion 20Cd of the electrode 20 with respect to the vertex 20E (the left side of the vertex 20E in FIG. 1). In addition, the extending portion 50A is connected to another part of the protective portion 40 (the peripheral portion 20B of the electrode 20), on a side closer to the outer edge portion 20Cd of the electrode 20 with respect to the vertex 20E (the right side of the vertex 20E in FIG. 1). Further, the extending portion 50A is in contact with the side surface of the electrode 20 adjacent to the outer edge portion 20Cd of the electrode 20, on a side opposite to the vertex 20E with respect to the location connected to the peripheral portion 20B of the electrode 20. The extending portion 50A is an example of a first extending portion.

The extending portion 50B is connected to a part of the protective portion 40 (the surrounding portion 10C, around the electrode 20, of the surface 10A of the substrate 10), on the side opposite to the outer edge portion 20Cd of the electrode 20 with respect to the vertex 20F (the right side of the vertex 20F in FIG. 1). In addition, the extending portion 50B is connected to another part of the protective portion 40 (the peripheral portion 20B of the electrode 20), on the side closer to the outer edge portion 20Cd of the electrode 20 with respect to the vertex 20F (the left side of the vertex 20F in FIG. 1). Further, the extending portion 50B is in contact with the side surface of the electrode 20 adjacent to the outer edge portion 20Cd of the electrode 20, on the side opposite to the vertex 20F with respect to the location connected to the peripheral portion 20B of the electrode 20. The extending portion 50B is an example of a second extending portion.

The extending portions 50A and 50B may be in contact with the surface 20A of the electrode 20 adjacent to the outer edge portion 20Cd of the electrode 20. Alternatively, the extending portions 50A and 50B are not necessarily in contact with the outer edge portion 20Cb of the electrode 20.

As illustrated in FIG. 3, each plating film 60 covers a part of the surface 20A of the corresponding electrode 20 and a part of the surface of the corresponding protective film 30.

The plating film 60 covers a portion, which is not covered with the protective film 30, of the electrode 20 and a portion, near the electrode 20, of the protective film 30. The portion, near the electrode 20, of the protective film 30 is a portion, which covers a part of the peripheral portion 20B of the electrode 208, of the protective film 30.

A portion 30A, near the electrode 20, of the protective film 30 is sandwiched between the electrode 20 and the plating film 60. This allows the protective film 30 to be less likely to be separated.

The plating films 60 are made of nickel, tin, gold, or the like. For example, in a case where the electrodes 20 are made of copper, the plating films 60 are made of nickel and tin. Alternatively, for example, in a case where the electrodes 20 are made of silver, the plating films 60 are made of nickel and gold.

Hereinafter, a method for manufacturing the foregoing electronic component 1 will be described with reference to FIGS. 4 to 11.

Figure 4:
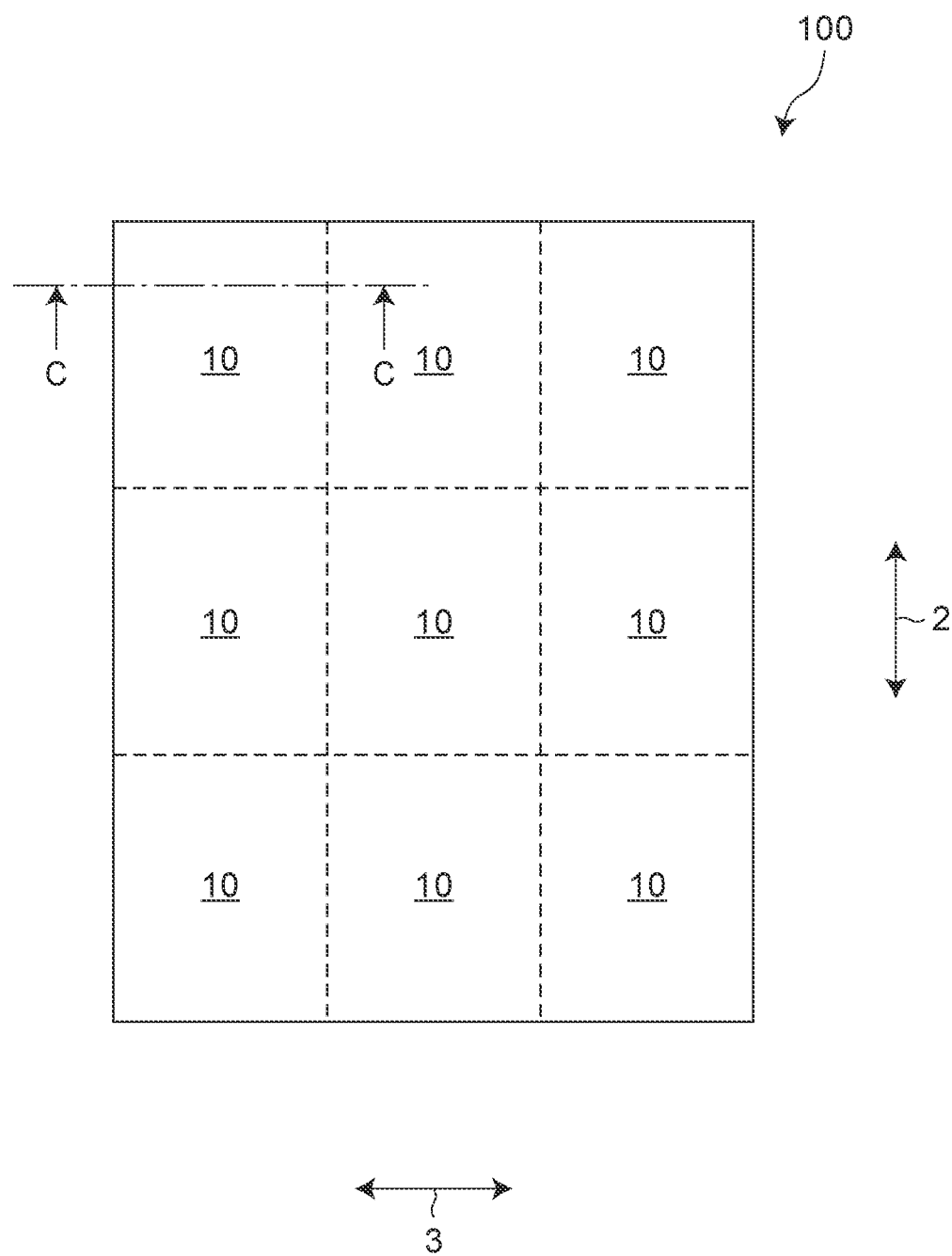
FIG. 4 is a plan view of a sheet.
Figure 5:
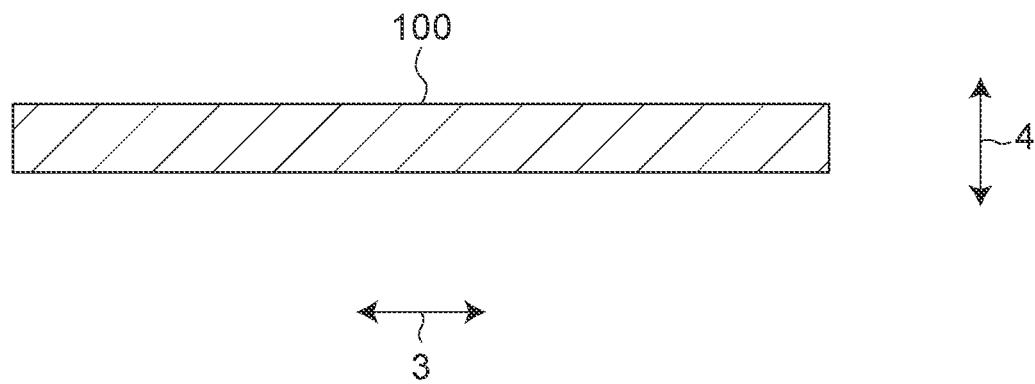
FIG. 5 is a sectional view taken along line C-C in FIG. 4.
Figure 6:
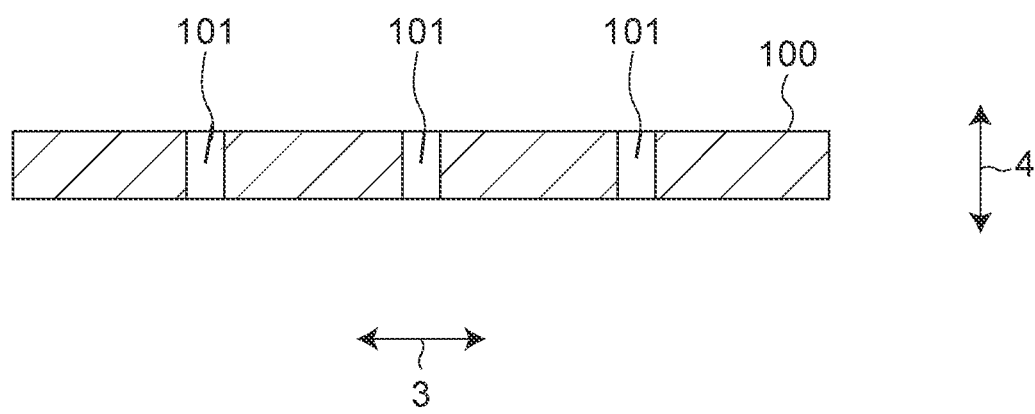
FIG. 6 is a sectional view of a sheet obtained in such a manner that a hole is bored in the sheet of FIG. 5.
Figure 7:
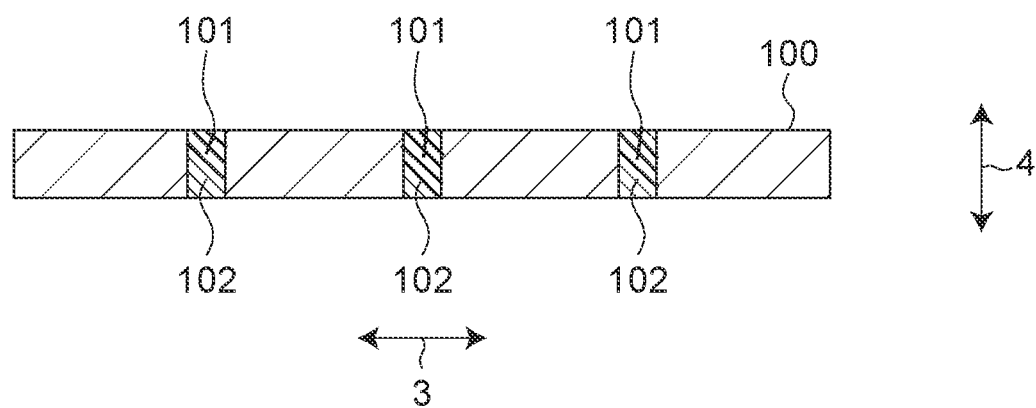
FIG. 7 is a sectional view of a sheet obtained in such a manner that the hole in the sheet of FIG. 6 is filled with a conductive paste.
Figure 8:
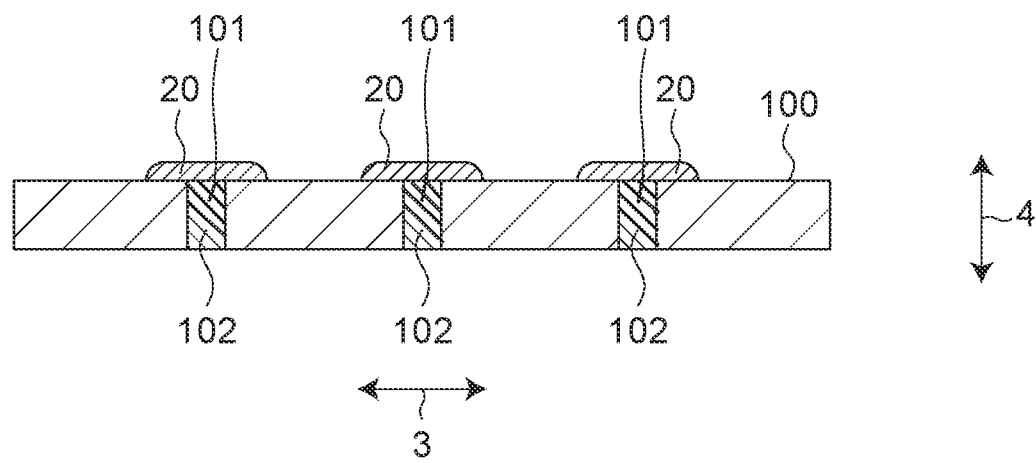
FIG. 8 is a sectional view of a sheet obtained in such a manner that an electrode is printed on the sheet of FIG. 7.
Figure 9:
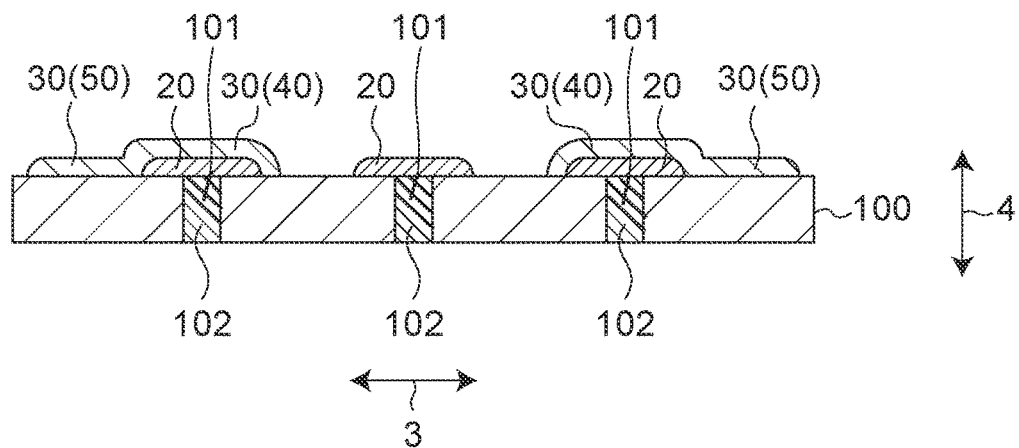
FIG. 9 is a sectional view of a sheet obtained in such a manner that a protective film is printed on the sheet of FIG. 8.
Figure 10:
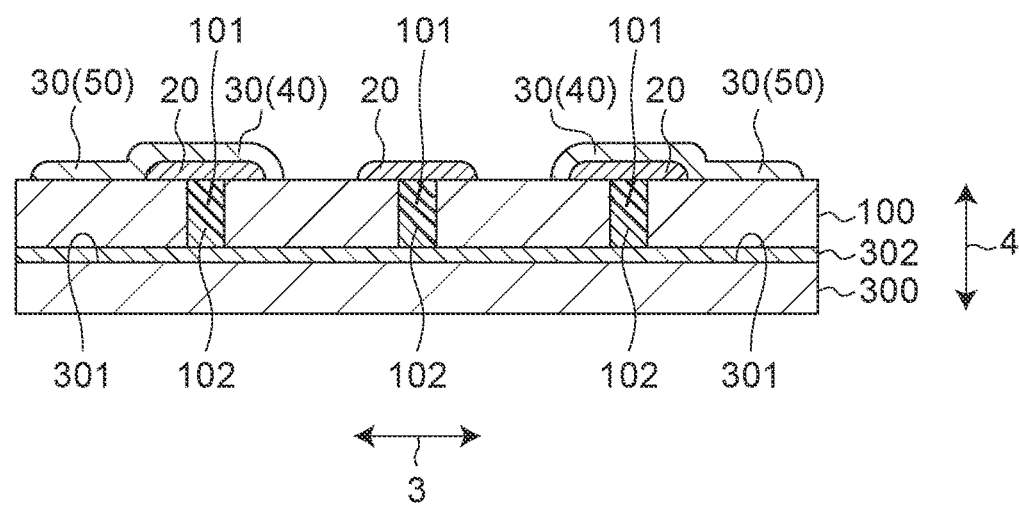
FIG. 10 is a sectional view of a sheet obtained in such a manner that the sheet of FIG. 9 is stacked on a sheet on which an internal electrode is printed.

FIG. 4 is a plan view of a sheet. FIG. 5 is a sectional view taken along line C-C in FIG. 4. FIG. 6 is a sectional view of a sheet obtained in such a manner that a hole is bored in the sheet of FIG. 5. FIG. 7 is a sectional view of a sheet obtained in such a manner that hole in the sheet of FIG. 6 is filled with a conductive paste. FIG. 8 is a sectional view of a sheet obtained in such a manner that an electrode is printed on the sheet of FIG. 7. FIG. 9 is a sectional view of a sheet obtained in such a manner that a protective film is printed on the sheet of FIG. 8. FIG. 10 is a sectional view of a sheet obtained in such a manner that the sheet of FIG. 9 is stacked on a sheet on which an internal electrode is printed. FIG. 11 is a sectional view of a sheet obtained in such a manner that the sheet of FIG. 10 is subjected to press bonding.

First, a first step is carried out. In the first step, a sheet 100 which is a base of a plurality of substrates 10 is formed (see FIGS. 4 and 5). The sheet 100 illustrated in FIGS. 4 and 5 is formed into a plate shape by spreading a mixture material of ceramic powder, glass, and the like in a plane. In the first embodiment, one sheet 100 is divided into nine substrates 10 by an eighth step to be described later.

Next, a second step is carried out. In the second step, holes are bored in the sheet 100 formed in the first step. Through holes 101 are formed in the sheet 100 by carrying out the second step, as illustrated in FIG. 6. The number of through holes 101 may be any number. In the first embodiment, nine through holes 101 are formed in a matrix for each region corresponding to each substrate 10 (for each region surrounded by broken lines in FIG. 4).

Next, a third step is carried out. In the third step, the through holes 101 formed in the second step are each filled with a conductive paste 102, and then the paste 102 is dried, as illustrated in FIG. 7.

The sheet 100 does not necessarily have the through holes 101. In this case, the second step and the third step are skipped.

Next, a fourth step is carried out. In the fourth step, electrodes 20 made of a conductive paste are printed on the sheet 100 subjected to the third step, as illustrated in FIG. 8. The electrodes 20 are printed by a known method such as screen printing. The configurations of the electrodes 20, such as a material, a size, a shape, and a number, are as described above. In the first embodiment, the electrodes 20 each have a square shape in plan view. In addition, in the first embodiment, each electrode 20 is printed directly above the corresponding through hole 101. Each electrode 20 is thus electrically connected to the paste 102 in the corresponding through hole 101.

Next, a fifth step is carried out. In the fifth step, protective films 30 are printed on the sheet 100 subjected to the fourth step, as illustrated in FIG. 9. The protective films 30 are printed by a known method such as screen printing. The configurations of the protective films 30, such as a material, a size, a shape, and a number, are as described above. That is, the protective films 30 each include the protective portion 40 and the extending portions 50 described above.

Next, a sixth step is carried out. In the sixth step, the sheet 100 subjected to the fifth step is stacked on another sheet 300 on which an electrode 302 is printed on a surface 301, as illustrated in FIG. 10. The electrode 302 is sandwiched between the sheet 100 and the sheet 300. The electrode 302 is electrically connected to the paste 102 in each through hole 101. That is, each electrode 20 printed on the sheet 100 is electrically connected to the electrode 302 with the paste 102 interposed between the sheet 100 and the electrode 302. While the sheet 100 is stacked on one sheet 300 in the first embodiment, the sheet 100 may be stacked on a stack of a plurality of sheets. Alternatively, the sheet 100 is not necessarily stacked on another sheet such as the sheet 300. In this case, the sixth step is skipped.

Next, a seventh step is carried out. In the seventh step, the sheet 100 subjected to the sixth step is subjected to press bonding. The protective films 30 are thus pushed into and embedded in the sheet 100, as illustrated in FIG. 11. The electrodes 20 are also pushed into the sheet 100. Here, the portions, which are covered with the protective portions 40 of the protective films 30, of the electrodes 20 are pushed by a larger amount than the portions, which are not covered with the protective films 30, of the electrodes 20. A part of each electrode 20 is curved due to a difference between the amounts of pushing, as illustrated in FIG. 3. The sixth step is not necessarily carried out.

Next, the eighth step is carried out. In the eighth step, the sheet 100 subjected to the seventh step is cut. One sheet 100 illustrated in FIG. 4 is cut at portions indicated by broken lines. As a result, a plurality of electronic components 1 as illustrated in FIGS. 1 to 3 (nine electronic components 1 in the case of the sheet 100 illustrated in FIG. 4) are formed.

Next, a ninth step is carried out to bevel four corners of each electronic component 1. The four corners of each electronic component 1 are rounded in FIG. 1; however, the four corners of each electronic component 1 may alternatively be, for example, chamfered. The ninth step is not necessarily carried out.

Next, a tenth step is carried out to fire each electronic component 1 subjected to the ninth step. The firing is performed at, for example, about 900° C. The tenth step is not necessarily carried out after the ninth step. For example, the tenth step may be carried out simultaneously with the seventh step, before the sheet 100 is cut.

Next, an eleventh step is carried out to plate the electrodes 20 printed in the fourth step. For example, in a case where the electrodes 20 are made of copper, the electrodes 20 are plated with nickel and tin. Alternatively, for example, in a case where the electrodes 20 are made of silver, the electrodes 20 are plated with nickel and gold. In the first embodiment, the electrodes 20 and the protective films 30 are plated. Specifically, in the first embodiment, the plating is performed over the portions, which are not covered with the protective films 30, of the electrodes 20 and the portions, near the electrodes 20, of the protective films 30. Plating films 60 are formed by carrying out the fourth step (see FIGS. 2 and 3).

The protective films 30 are not necessarily plated. More specifically, while the portions, which are not covered with the protective films 30, of the electrodes 20 are plated, the protective films 30 are not necessarily plated.

According to the first embodiment, the protective portion 40 is reinforced by the extending portion 50 extending from the protective portion 40. It is thus possible to reduce a possibility that the protective portion 40 is separated from the electrode 20 and the substrate 10.

In a case where an external impact acts on the electronic component 1, the closer to the outer edge portions 10B, the more the substrate 10 bends. According to the first embodiment, the extending portion 50 extends toward the outer edge portion 10B of the substrate 10, where the substrate 10 bends largely. Separation of the protective portion 40 from the electrode 20 and the substrate 10 due to bending of the substrate 10 is thus inhibited by the extending portion 50.

According to the first embodiment, in a case where an external impact acts on the electronic component 1, the closer to the outer edge portions 10B, the more the substrate 10 bends. According to the first embodiment, the extending portion 50 extends to the vicinity of the outer edge portions 10B of the substrate 10, where the substrate 10 bends largely. Separation of the protective portion 40 from the electrode 20 and the substrate 10 due to bending of the substrate 10 is thus inhibited by the extending portion 50.

According to the first embodiment, the extending portion 50 is long in the extending direction 5. It is thus possible to reduce a possibility that the extending portion 50 is separated from the substrate 10 by an external impact. As a result, it is possible to reduce a possibility that the protective portion 40 is separated from the electrode 20 and the substrate 10.

In the outer edge portions 20C of the quadrilateral electrode 20, the bonding strength of the vertex portion to the substrate 10 tends to weaken. According to the first embodiment, the extending portion 50 extends from the boundary portion between the adjacent two outer edge portions 20Ca and 20Cb of the quadrilateral electrode 20, that is, the vertex portion of the quadrilateral electrode 20. It is therefore possible to increase the bonding of the vertex portion of the quadrilateral electrode 20 to the substrate 10.

In a case where an external impact acts on the electronic component 1, the closer to the outer edge portions 10B, the more the substrate 10 bends. In a configuration in which the plurality of electrodes 20 are formed on the surface 10A of the substrate 10, therefore, the electrodes 202 to 209 located at the outermost periphery among the plurality of electrodes 201 to 209 are greatly affected by the bending of the substrate 10. That is, in a case where the substrate 10 bends, the protective portions 40 covering the electrodes 202 to 209 located at the outermost periphery are likely to be separated from the electrodes 20 and the substrate 10. According to the first embodiment, each of the electrodes 202 to 209 located at the outermost periphery is covered with the corresponding protective portion 40 from which the extending portion 50 extends. It is thus possible to inhibit separation of the protective portions 40, which cover the electrodes 202 to 209 located at the outermost periphery, from the electrodes 20 and the substrate 10 by the extending portions 50.

In a case where an external impact acts on the electronic component 1, the closer to the outer edge portions 10B, the more the substrate 10 bends. In a case where the substrate 10 bends, therefore, in each of the quadrilateral electrodes 202 to 209 located at the outermost periphery, the portion closer to the corresponding outer edge portion 10B of the substrate 10 is largely affected by the bending of the substrate 10. That is, in a case where the substrate 10 bends, in the protective portions 40 covering the quadrilateral electrodes 202 to 209 located at the outermost periphery, the protective portions 40 covering the portions closer to the outer edge portions 10B of the substrate 10 are likely to be separated from the electrodes 20 and the substrate 10. According to the first embodiment, in each of the quadrilateral electrodes 202 to 209 located at the outermost periphery, the extending portion 50 is provided near the outer edge portion 10B of the substrate 10. It is thus possible to inhibit separation of the protective portions 40, which cover the electrodes 202 to 209 located at the outermost periphery, from the electrodes 20 and the substrate 10 by the extending portions 50.

If the plurality of extending portions 50 are connected to each other, the area of each of the plurality of extending portions 50 connected to each other increases. This increases an influence of the contraction of the substrate 10 on the extending portion 50 because of a difference in contraction ratio between the extending portion 50 and the substrate 10, which may cause the extending portion 50 to crack. According to the first embodiment, each of the extending portions 50 is spaced away from the other extending portions 50. An increase in area of the extending portion 50 is thus inhibited. As a result, it is possible to reduce a possibility of occurrence of the foregoing cracking of the extending portion 50.

In the first embodiment, as illustrated in FIG. 1, each of the protective portions 40 that cover the electrodes 202, 204, 206, and 208 covers the peripheral portion 20B corresponding to two sides of the square of the surface 20A of the corresponding one of the electrodes 202, 204, 206, and 208. In addition, each of the protective portions 40 that cover the electrodes 203, 205, 207, and 209 covers the peripheral portion 20B corresponding to three sides of the square of the surface 20A of the corresponding one of the electrodes 203, 205, 207, and 209. However, the portion of each electrode 20, where the corresponding protective portion 40 covers, is not limited to the configuration illustrated in FIG. 1.

For example, each of the protective portions 40 that cover the electrodes 202, 204, 206, and 208 may cover the peripheral portion 20B corresponding to three sides of the square of the surface 20A of the corresponding one of the electrodes 202, 204, 206, and 208.

Figure 12:
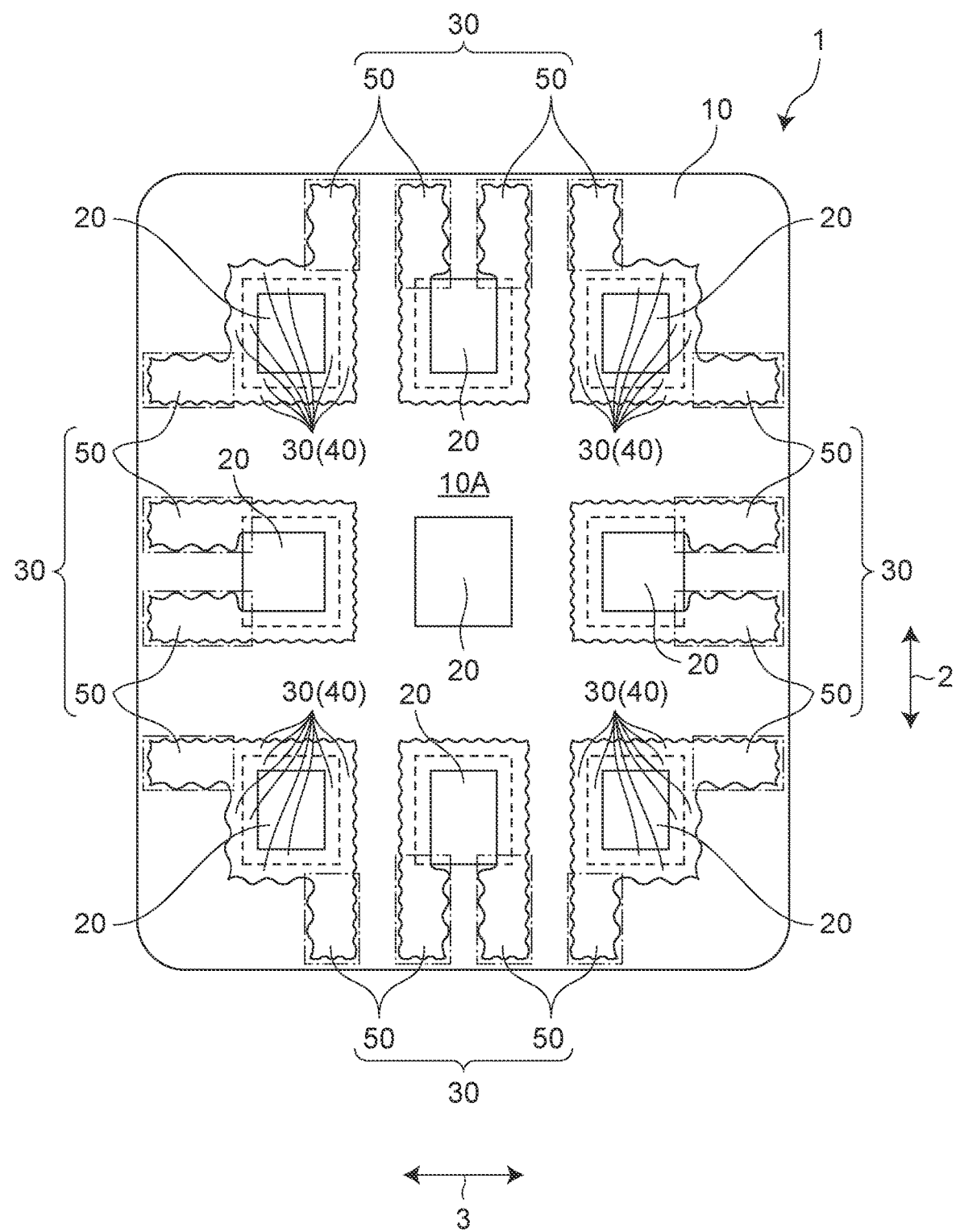
FIG. 12 is a plan view of an electronic component according to a modification of the first embodiment of the present disclosure.
Figure 13:
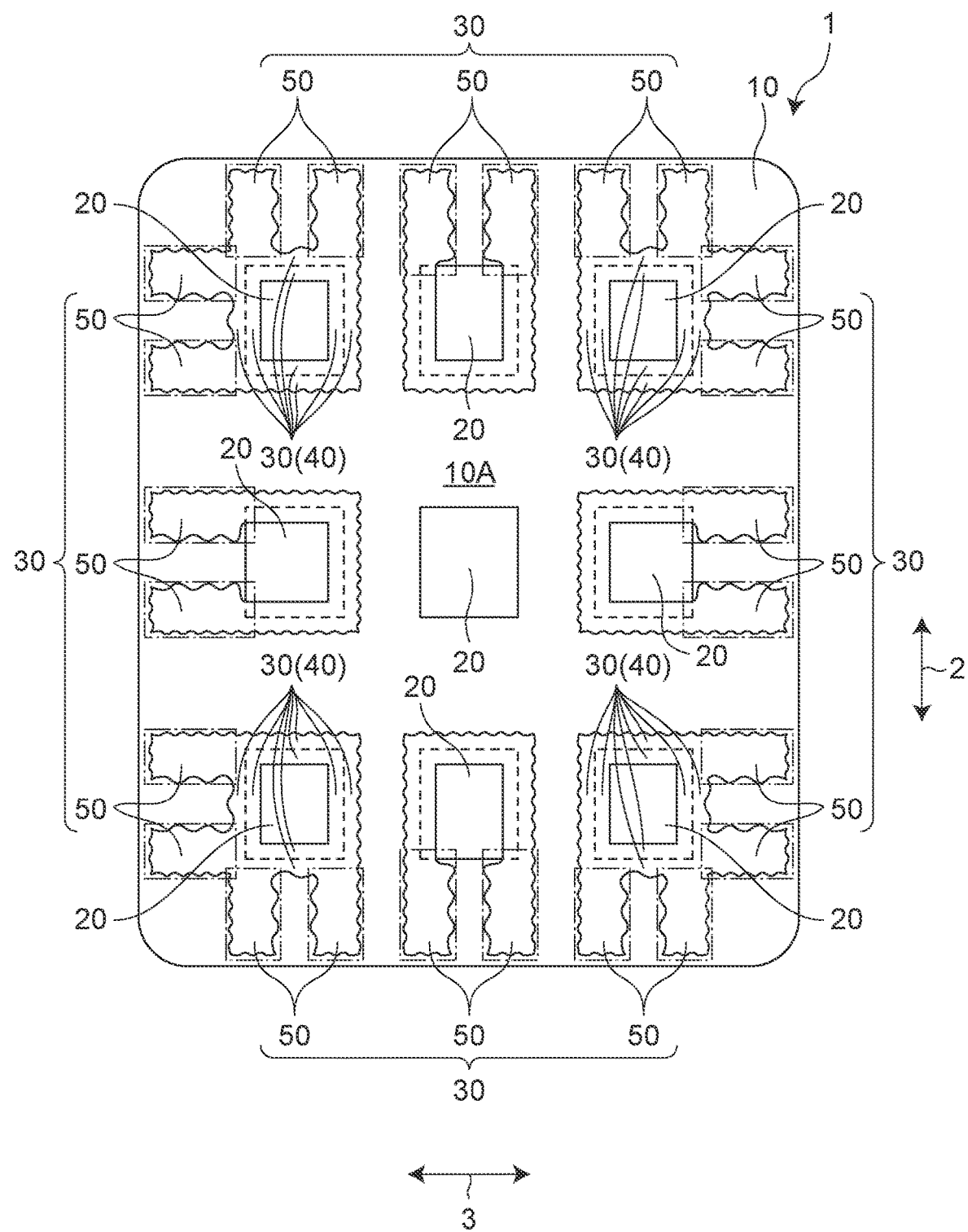
FIG. 13 is a plan view of an electronic component according to another modification of the first embodiment of the present disclosure.

Alternatively, for example, each protective portion 40 may cover the entire peripheral portion 20B of the corresponding electrode 20. For example, each of the protective portions 40 that cover the electrodes 202, 204, 206, and 208 may cover the peripheral portion 20B corresponding to four sides (all sides) of the square of the surface 20A of the corresponding one of the electrodes 202, 204, 206, and 208, as illustrated in FIGS. 12 and 13. That is, each protective portion 40 is only required to cover at least a part of the peripheral portion 20B of the corresponding electrode 20.

In the first embodiment, the protective films 30 that cover the electrodes 202 to 209 each include two extending portions 50, as illustrated in FIG. 1. However, the number of extending portions 50 of each protective film 30 is not limited to two. In addition, the protective films 30 may be equal in number of extending portions 50 to each other or may be different in number of extending portions 50 from each other.

For example, each of the protective films 30 that cover the electrodes 203, 205, 207, and 209 may include two extending portions 50, while each of the protective films 30 that cover the electrodes 202, 204, 206, and 208 may include four extending portions 50, as illustrated in FIG. 13.

Second Embodiment

Figure 14:
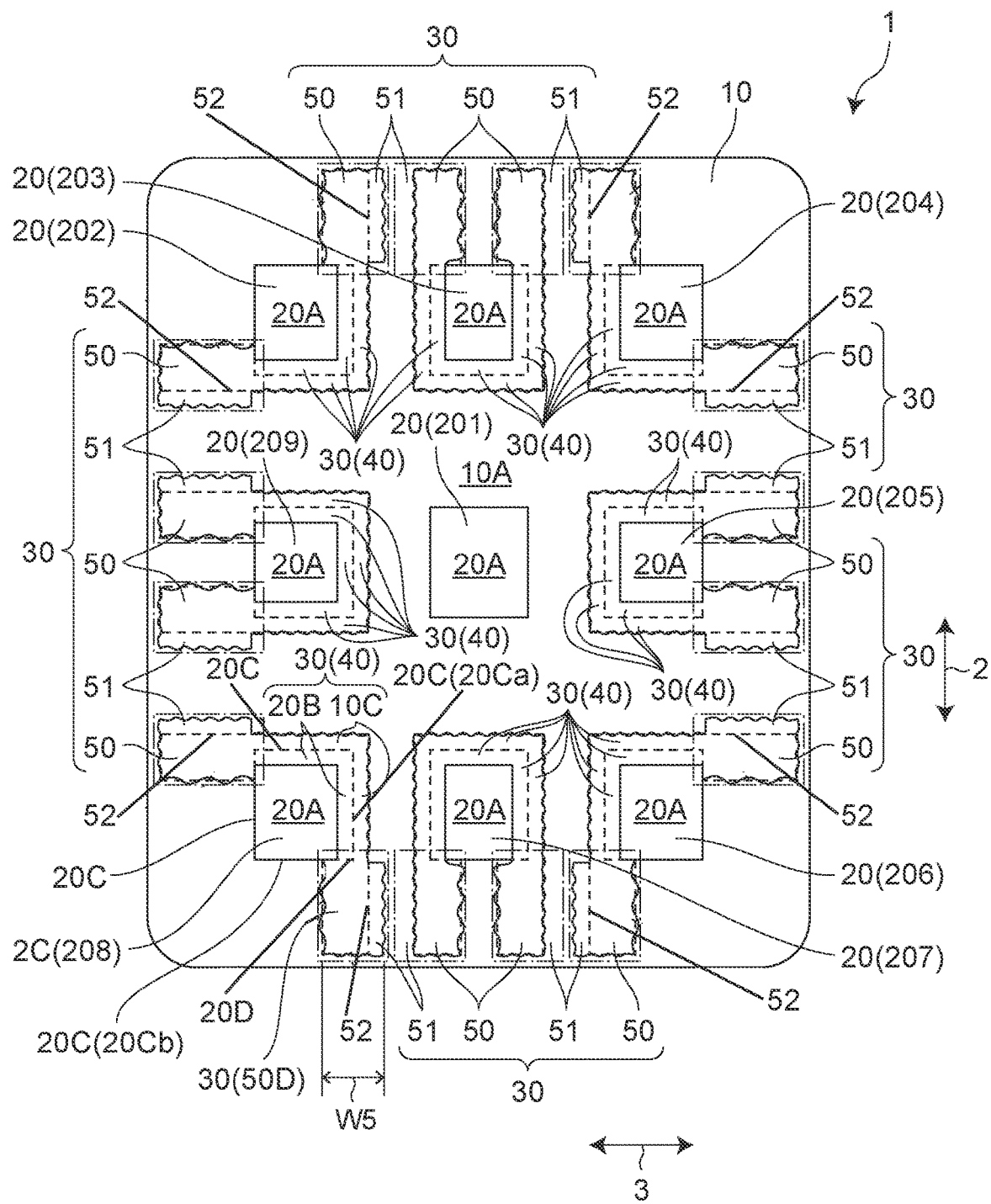
FIG. 14 is a plan view of an electronic component according to a second embodiment of the present disclosure.

FIG. 14 is a plan view of an electronic component according to a second embodiment of the present disclosure. An electronic component 1 according to the second embodiment is different from the electronic component 1 according to the first embodiment in a respect that an extending portion 50 includes an expanding portion 51.

The electronic component 1 includes a plurality of the extending portions 50 some of which or all of which include the expanding portion 51. In FIG. 14, all the extending portions 50 include the expanding portion 51. In the following description of FIG. 14, components identical with those of FIG. 1 are denoted with the same reference signs; therefore, the description thereof will not be given. In addition, since the expanding portions 51 are equal in configuration to each other, a configuration of an expanding portion 51 of an extending portion 50D, which is one of two extending portions 50 of a protective film 30 covering an electrode 208, will be described below. The configurations of the expanding portions 51 of the other extending portions 50 will not be described.

The expanding portion 51 of the extending portion 50D is formed on a side opposite to a vertex 20D with respect to a location where the extending portion 50D is connected to a surrounding portion 10C, around an electrode 20, of a surface 10A of a substrate 10. In other words, the expanding portion 51 of the extending portion 50D expands toward a side opposite to an outer edge portion 20Cb of the electrode 20 with respect to an imaginary line 52 indicated by a broken line in FIG. 14. This causes a width W5 of the extending portion 50D of the second embodiment to be longer than the width W4 of the extending portion 50D of the first embodiment (see FIG. 1).

According to the second embodiment, the expanding portion 51 increases the area of the extending portion 50. It is therefore possible to reduce a possibility that the extending portion 50 is separated from the substrate 10. It is thus possible to reduce a possibility that a protective portion 40 is separated from the electrode 20 and the substrate 10.

It should be noted that advantageous effects of each of the embodiments may be achieved by appropriately combining any embodiments of the various embodiments described above.

Although the present disclosure has been fully described in connection with the preferred embodiments thereof with reference to the accompanying drawings, it is to be noted that various changes and modifications are apparent to those skilled in the art. Such changes and modifications are to be understood as included within the scope of the present disclosure as defined by the appended claims unless the changes and modifications depart from the scope of the present disclosure.

1 electronic component
5 extending direction
10 substrate
10A surface
10B outer edge portion
10C surrounding portion
20 electrode
20B peripheral portion
20C outer edge portion
20Ca outer edge portion (first side)
20Cb outer edge portion (second side)
20D vertex (boundary portion)
40 protective portion
50 extending portion
51 expanding portion
52 imaginary line
60 plating film
L1 length of extending portion in extending direction
L2 length of extending portion in extending direction
W1 width of protective portion
W3 width of surrounding portion around electrode
W4 width of extending portion

The invention claimed is:

1. An electronic component comprising:
a substrate;
at lease one electrode provided on a surface of the substrate;
a protective portion covering at least a part of a peripheral portion of the electrode and a surrounding portion, around the electrode, of the surface of the substrate, across outer edge portions of the electrode, and extending in a circumferential direction along the outer edge portions of the electrode; and
at lease one extending portion contiguous, on the surface of the substrate, with one end portion of the protective portion in the circumferential direction, and extending in an extending direction away from the protective portion and the electrode,
wherein a width of the extending portion perpendicular to the extending direction is longer than a width of the protective portion perpendicular to the extending direction at the one end portion of the protective portion in a case where the substrate is seen in plan view.

2. The electronic component according to claim 1, wherein
the extending portion extends toward a closest outer edge portion among outer edge portions of the substrate.

3. The electronic component according to claim 2, wherein
the extending portion extends to a vicinity of the outer edge portions of the substrate.

4. The electronic component according to claim 2, wherein
a length of the extending portion in the extending direction is longer than a width of a surrounding portion, around the electrode, of the protective portion.

5. The electronic component according to claim 2, wherein
a surface of the electrode has a quadrilateral shape,
the protective portion covers the peripheral portion of the electrode and the surrounding portion, around the electrode, of the surface of the substrate, across a first side of the surface of the electrode, and extends along the first side, and
the extending portion extends in the extending direction from a boundary portion between the first side and a second side, adjacent to the first side, of the surface of the electrode, and is in contact with a side surface, adjacent to the second side, of the electrode.

6. The electronic component according to claim 2, wherein
a surface of the electrode has a quadrilateral shape,
the protective portion covers the peripheral portion of the electrode and the surrounding portion, around the electrode, of the surface of the substrate, across a first side of the surface of the electrode and a third side of the surface of the electrode, the third side connected to the first side with a second side of the surface of the electrode interposed between the third side and the first side, the third side extending in parallel to the first side, and extends along the first side and the third side,
the extending portion includes:
a first extending portion extending in the extending direction from a boundary portion between the first side and the second side; and
a second extending portion extending in the extending direction from a boundary portion between the third side and the second side, and
the first extending portion and the second extending portion are in contact with a side surface, adjacent to the second side, of the electrode.

7. The electronic component according to claim 1, wherein
the extending portion extends to a vicinity of outer edge portions of the substrate.

8. The electronic component according to claim 7, wherein a length of the extending portion in the extending direction is longer than a width of a surrounding portion, around the electrode, of the protective portion.

9. The electronic component according to claim 7, wherein
a surface of the electrode has a quadrilateral shape,
the protective portion covers the peripheral portion of the electrode and the surrounding portion, around the electrode, of the surface of the substrate, across a first side of the surface of the electrode, and extends along the first side, and
the extending portion extends in the extending direction from a boundary portion between the first side and a second side, adjacent to the first side, of the surface of the electrode, and is in contact with a side surface, adjacent to the second side, of the electrode.

10. The electronic component according to claim 7, wherein
a surface of the electrode has a quadrilateral shape,
the protective portion covers the peripheral portion of the electrode and the surrounding portion, around the electrode, of the surface of the substrate, across a first side of the surface of the electrode and a third side of the surface of the electrode, the third side connected to the first side with a second side of the surface of the electrode interposed between the third side and the first side, the third side extending in parallel to the first side, and extends along the first side and the third side,
the extending portion includes:
a first extending portion extending in the extending direction from a boundary portion between the first side and the second side; and
a second extending portion extending in the extending direction from a boundary portion between the third side and the second side, and
the first extending portion and the second extending portion are in contact with a side surface, adjacent to the second side, of the electrode.

11. The electronic component according to claim 1, wherein
a length of the extending portion in the extending direction is longer than a width of a surrounding portion, around the electrode, of the protective portion.

12. The electronic component according to claim 11, wherein
a surface of the electrode has a quadrilateral shape,
the protective portion covers the peripheral portion of the electrode and the surrounding portion, around the electrode, of the surface of the substrate, across a first side of the surface of the electrode, and extends along the first side, and
the extending portion extends in the extending direction from a boundary portion between the first side and a second side, adjacent to the first side, of the surface of the electrode, and is in contact with a side surface, adjacent to the second side, of the electrode.

13. The electronic component according to claim 11, wherein
a surface of the electrode has a quadrilateral shape,
the protective portion covers the peripheral portion of the electrode and the surrounding portion, around the electrode, of the surface of the substrate, across a first side of the surface of the electrode and a third side of the surface of the electrode, the third side connected to the first side with a second side of the surface of the electrode interposed between the third side and the first side, the third side extending in parallel to the first side, and extends along the first side and the third side,
the extending portion includes:
a first extending portion extending in the extending direction from a boundary portion between the first side and the second side; and
a second extending portion extending in the extending direction from a boundary portion between the third side and the second side, and
the first extending portion and the second extending portion are in contact with a side surface, adjacent to the second side, of the electrode.

14. The electronic component according to claim 1, wherein
a surface of the electrode has a quadrilateral shape,
the protective portion covers the peripheral portion of the electrode and the surrounding portion, around the electrode, of the surface of the substrate, across a first side of the surface of the electrode, and extends along the first side, and
the extending portion extends in the extending direction from a boundary portion between the first side and a second side, adjacent to the first side, of the surface of the electrode, and is in contact with a side surface, adjacent to the second side, of the electrode.

15. The electronic component according to claim 14, wherein
the extending portion includes an expanding portion expanding toward a side opposite to the second side of the surface of the electrode with respect to an imaginary line passing through the first side of the surface of the electrode.

16. The electronic component according to claim 1, wherein
a surface of the electrode has a quadrilateral shape,
the protective portion covers the peripheral portion of the electrode and the surrounding portion, around the electrode, of the surface of the substrate, across a first side of the surface of the electrode and a third side of the surface of the electrode, the third side connected to the first side with a second side of the surface of the electrode interposed between the third side and the first side, the third side extending in parallel to the first side, and extends along the first side and the third side,
the extending portion includes:
a first extending portion extending in the extending direction from a boundary portion between the first side and the second side; and
a second extending portion extending in the extending direction from a boundary portion between the third side and the second side, and
the first extending portion and the second extending portion are in contact with a side surface, adjacent to the second side, of the electrode.

17. The electronic component according to claim 16, wherein
the extending portion includes an expanding portion expanding toward a side opposite to the second side of the surface of the electrode with respect to an imaginary line passing through the first side of the surface of the electrode.

18. The electronic component according to claim 1, wherein the at least one electrode includes a plurality of electrodes,
wherein an electrode located on an outermost periphery of the surface of the substrate among the plurality of electrodes is covered with the protective portion from which the extending portion extends, and the extending portion extends toward a closest outer edge portion among outer edge portions of the substrate.

19. The electronic component according to claim 18, wherein a surface of each electrode has a quadrilateral shape, and the extending portion is located between a side located on a peripheral side of the surface of the substrate among sides of the surface of the electrode, and an outer edge portion closest to the electrode among the outer edge portions of the substrate.

20. The electronic component according to claim 1, wherein the at least one extending portion includes a plurality of extending portions, wherein each of the plurality of extending portions is spaced away from any other ones of the plurality of extending portions.

* * * * *